United States Patent
Thompson

(10) Patent No.: US 9,200,365 B2
(45) Date of Patent: Dec. 1, 2015

(54) METHOD OF CATALYTIC FILM DEPOSITION

(71) Applicant: David Thompson, San Jose, CA (US)

(72) Inventor: David Thompson, San Jose, CA (US)

(73) Assignee: Applied Material, Inc., Santa Clara, CA (US)

(*) Notice: Subject to any disclaimer, the term of this patent is extended or adjusted under 35 U.S.C. 154(b) by 289 days.

(21) Appl. No.: 13/967,760

(22) Filed: Aug. 15, 2013

(65) Prior Publication Data

US 2014/0050849 A1 Feb. 20, 2014

Related U.S. Application Data

(60) Provisional application No. 61/683,471, filed on Aug. 15, 2012.

(51) Int. Cl.
*C23C 16/40* (2006.01)
*C23C 16/44* (2006.01)
*C23C 16/455* (2006.01)

(52) U.S. Cl.
CPC ........... *C23C 16/402* (2013.01); *C23C 16/44* (2013.01); *C23C 16/45534* (2013.01)

(58) Field of Classification Search
CPC .... C23C 16/40; C23C 16/401; C23C 16/402; C23C 16/45525
See application file for complete search history.

(56) References Cited

U.S. PATENT DOCUMENTS

| | | |
|---|---|---|
| 6,818,250 B2 | 11/2004 | George et al. |
| 7,897,208 B2 | 3/2011 | Mahajani et al. |
| 2006/0251795 A1* | 11/2006 | Kobrin et al. ............... 427/2.1 |
| 2011/0251446 A1* | 10/2011 | Kamatani et al. ............ 585/27 |
| 2012/0058270 A1* | 3/2012 | Winter et al. .......... 427/255.26 |
| 2013/0052816 A1* | 2/2013 | Kambayashi et al. ...... 438/605 |
| 2013/0243971 A1* | 9/2013 | Thompson et al. ......... 427/554 |

OTHER PUBLICATIONS

Bachmann, Julien, et al., "A Practical, Self-Catalytic, Atomic Layer Deposition of Silicon Dioxide". Angewandte Chemie Int. Ed., 2008, 47, 6177-6179.*
Bhaviripudi, Sreekar, et al., "CVD Synthesis of Single-Walled Carbon Nanotubes from Gold Nanoparticle Catalysts". J. Am. Chem. Soc. 2007, 129, 1516-1517.*
Xu, Peng, et al., "Patterned Carbon Nanotubes Fabricated by the Combination of Microcontact Printing and Diblock Copolymer Micelles". Journal of Nanoscience and Nanotechnology, vol. 10, 508-513, 2010.*
Liu, Yang, et al., "Synthesis of Copper Nanocatalysts with Tunable Size Using Diblock Copolymer Solution Micelles". J. Phys. Chem. C 2010, 114, 5767-5772.*
Rai, Vikrant R., et al., "Mechanism of Self-catalytic Atomic Layer Deposition of Silicon Dioxide Using 3-Aminopropyl Triethoxysilane, Water, and Ozone". Chemistry of Materials, 2011, 23, 2312-2316.*
Hiller, D., et al., "Low temperature silicon dioxide by thermal atomic layer deposition: Investigation of material properties". Journal of Applied Physics 107, 064314 (2010).*
Du, Y. et al., "Mechanism of Pyridine-Catalyzed $SiO_2$ Atomic Layer Deposition Studied by Fourier Transform Infrared Spectroscopy", *J. Phys. Chem C*, 111 2007, 219-226.
George, Steven M., "Atomic Layer Deposition: An Overview", *Chem. Rev.* 11 2010, 111-131.

* cited by examiner

*Primary Examiner* — Bret Chen
(74) *Attorney, Agent, or Firm* — Servilla Whitney LLC

(57) ABSTRACT

Provided are methods of catalytic atomic layer deposition using pyridine-based catalysts. Certain methods comprising activating a reaction between at least two film precursors and certain other methods of catalytic deposition of $SiO_2$, both of which comprise using a pyridine-based catalyst.

20 Claims, No Drawings

METHOD OF CATALYTIC FILM DEPOSITION

CROSS-REFERENCE TO RELATED APPLICATIONS

This application claims priority to U.S. Provisional Application No. 61/683,471, filed Aug. 15, 2012, the entire contents of which are incorporated herein by reference.

TECHNICAL FIELD

The present invention relates generally to methods of depositing thin films and catalysts useful in such methods. In particular, the invention relates to the use of pyridine-based catalysts in catalytic deposition processes.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In step B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain the desired film thickness.

In order to facilitate deposition, catalysts have been used during some ALD processes. Such catalysts have included amine-based catalysts. The catalyst is used to activate a reaction between two or more species. However, because the catalyst is aiding in the deposition process, the catalyst must be present near the surface of the substrate on which the film is intended to be grown; otherwise the reaction will not be catalyzed. Additionally, as the substrate temperature increases, the activity of the catalyst decreases. This makes the lifetime of the catalyst fairly low. To address these problems, one approach has been to increase the concentration of the catalyst in the deposition chamber, which should result in more catalyst at the surface. However, it is difficult to accomplish this while still keeping the vapor pressure sufficiently low enough to be practical in a deposition process. Thus, there is a need for improved methods of catalytic deposition.

SUMMARY

One aspect of the invention relates to a method depositing a film on a substrate surface, the method comprising activating a reaction between at least two film precursors with a catalyst having a structure represented by:

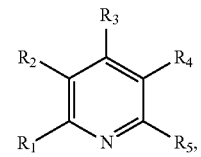

wherein $R_1$, $R_2$, $R_3$, $R_4$ and $R_5$ are independently H or $C_{1-10}$ alkyl, with the proviso that $R_1$, $R_2$, $R_3$, $R_4$, and $R_5$ are not all H, and the catalyst is present adjacent the substrate surface during the reaction. Various embodiments are listed below. It will be understood that the embodiments listed below may be combined not only as listed below, but in other suitable combinations in accordance with the scope of the invention.

In one or more embodiments, the catalyst has a vapor pressure below about $4 \times 10^{-5}$ Torr at 300 K. In one or more embodiments, the catalyst has a vapor pressure below that of pyridine. In some embodiments, $R_1$, $R_2$, $R_4$, and $R_5$ are H and $R_3$ is t-butyl. In some embodiments, the catalyst has a molar mass of between about 93.13 g/mol and 150 g/mol.

In one or more embodiments, the substrate surface has a temperature that is maintained above about 75, 150 or 200° C. during the reaction. In one or more embodiments, the substrate surface has a temperature that is maintained below about 600° C. during the reaction.

Another aspect of the invention relates to a method of catalytic deposition of $SiO_2$. The method comprises: exposing a substrate surface to a flow of a silicon precursor; reacting the silicon precursor with an oxidizing source in the presence of a catalyst having a structure represented by:

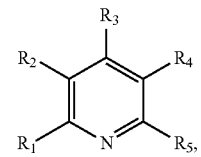

wherein $R_1$, $R_2$, $R_3$, $R_4$ and $R_5$ are independently H or $C_{1-10}$ alkyl, with the proviso that $R_1$, $R_2$, $R_3$, $R_4$, and $R_5$ are not all H.

In one or more embodiments, the catalyst has a vapor pressure below about $4 \times 10^{-5}$ Torr at 300 K. In one or more embodiments, the catalyst has a vapor pressure below that of pyridine. In some embodiments, $R_1$, $R_2$, $R_4$, and $R_5$ are H and $R_3$ is t-butyl. In some embodiments, the catalyst has a molar mass of between about 93.13 g/mol and 150 g/mol.

In one or more embodiments, the substrate surface has a temperature that is maintained above about 75, 150 or 200° C. during the reaction. In one or more embodiments, the substrate surface has a temperature that is maintained below about 600° C. during the reaction.

A third aspect of the invention relates to a method of catalytic deposition of $SiO_2$, the method comprising: exposing a substrate surface to a flow of a silicon precursor; reacting the silicon precursor with water and in the presence of a catalyst comprising 4-tert-butylpyridine. In one or more embodiments, the substrate surface has a temperature that is maintained above about 75, 150 or 200° C. during the reaction. In one or more embodiments, the substrate surface has a temperature that is maintained below about 600° C. during the reaction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

In one aspect of the invention, a film is formed by activating at least two film precursors with a catalyst having a structure represented by formula (I):

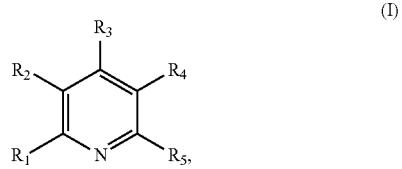

(I)

wherein $R_1$, $R_2$, $R_3$, $R_4$ and $R_5$ are independently H or $C_{1-10}$ alkyl, with the proviso that $R_1$, $R_2$, $R_3$, $R_4$, and $R_5$ are not all H, and the catalyst is present adjacent the substrate surface during the reaction. In some embodiments, any one of $R_1$, $R_2$, $R_3$, $R_4$ or $R_5$ may be a t-butyl substituent. In further embodiments, $R_3$ may be a t-butyl substituent, that is, para to the nitrogen in the pyridine ring.

The above method applies to any atomic layer or chemical vapor deposition reaction where a catalyst may be used. One example of an atomic layer deposition reaction is for the deposition of $SiO_2$. Accordingly, another aspect of the invention relates to a method of catalytic deposition of $SiO_2$. The method comprises exposing a substrate surface to a flow of a silicon precursor; reacting the silicon precursor with an oxidizing source in the presence of a catalyst having a structure represented by formula (I) shown above. In one or more embodiments, "exposure of a substrate surface" to a precursor may result in the precursor forming a layer on the surface comprising the precursor bound to the surface by the metal. In some embodiments, "exposure of a substrate surface" may refer to providing a precursor at the substrate surface.

Any suitable silicon precursor may be used. Examples of such precursors include, but are not limited to, silanes, alkylsilanes, aminosilanes, alkylaminosilanes, silanols, or alkoxy silanes. For example, silicon precursors may include $(Me_2N)_4Si$, $(Me_2N)_3SiH$, $(Me_2N)_2SiH_2'$ $(Me_2N)SiH_3$, $(Et_2N)_4Si$, $(Et_2N)_3SiH$, $(MeEtN)_4Si$, $(MeEtN)_3 SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSi(OH)_3$, $Me_2Si(OH)_2$, $(MeO)_4Si$, $(EtO)_4Si$, or derivatives thereof. Other alkylaminosilane compounds useful as silicon precursors include $(RR'N)_{4-n}SiH_n$ where R or R' are independently hydrogen, methyl, ethyl, propyl or butyl and n=0-3. Other alkoxy silanes may be described by the generic chemical formula $(RO)_{4-n}SiL_n$ where R=methyl, ethyl, propyl or butyl and L=H, OH, F, Cl, Br or I and mixtures thereof. Also, higher silanes may be used as silicon precursors within some embodiments of the invention. In some embodiments, the silicon precursor may comprise tris(dimethylamino)silane $((Me_2N)_3SiH$ or Tris-DMAS), tetrakis(dimethylamino)silane $((Me_2N)_4Si$ or TDMAS) or other dialkylaminosilanes, while in other embodiments the silicon precursor may comprise silane (SiH4). In yet other embodiments, the silicon precursor may comprise hexachlorodisilane (HCDS).

The oxidizing source for forming an oxide (e.g. silicon dioxide) during the ALD process may comprise, without limitation, oxygen ($O_2$), ozone ($O_3$), atomic-oxygen (O), hydrogen peroxide ($H_2O_2$), nitrous oxide ($N_2O$), nitric oxide (NO), dinitrogen pentoxide ($N_2O_5$), nitrogen dioxide ($NO_2$), water ($H_2O$), derivatives thereof or combinations thereof. In the exemplified embodiments, the oxidizing source comprises water ($H_2O$).

The precursors may be flowed and/or exposed to the substrate surface either sequentially or substantially simultaneously. As used herein, "substantially simultaneously" refers to either co-flow or where there is merely overlap between exposures of the precursors. In one or more embodiments, the catalyst is added with any one or more of the reactants. In other embodiments, the catalyst is added alone, before and/or after any of the precursors.

While not wishing to be bound to any particular theory, it is thought that compounds of formula (I) have a relatively low vapor pressure. This allows for the availability of the catalyst at the surface to be maintained, thus allowing sufficient film growth. For example, in some embodiments, the catalyst is in a gaseous state under reaction conditions and has a vapor pressure below about $4 \times 10^{-5}$ Torr at 300 K and/or a vapor pressure below that of pyridine. In some embodiments, the catalyst of formula (I) has a vapor pressure below that of pyridine.

In one or more embodiments of the invention, the catalyst may act as a Lewis base. The nitrogen atom of the catalyst according to embodiments of the invention may have an affinity for Lewis acid sites that are approximately equal to that of the nitrogen atom in pyridine. Under reaction conditions, the catalysts used in embodiments of the present invention are adapted to facilitate hydrogen bonding between the Lewis base-catalyst and the surface species of the ALD. Additionally, the embodiments of the present invention are adapted to facilitate hydrogen bonding between the Lewis base-catalyst and the oxidizing source (e.g. $H_2O$).

In various embodiments, the molecular weight, structure, and position of the $C_{1-10}$ alkyl of the catalyst will be adapted to give the catalyst a low vapor pressure as the specific situation calls for, which is well within the purview of one of ordinary skill in the art. In various embodiments, the position and structure of the $C_{1-10}$ alkyl will be adapted to give the catalyst a vapor pressure equal to, or below that of pyridine. Thus, for example, in one or more embodiments of the invention, the structure of the $C_{1-10}$ alkyl will be adapted to give the catalyst a total molar mass of between about 93.13 g/mol and 150 g/mol.

In one or more embodiments of the invention, the reaction conditions for the ALD reaction will be selected based on the properties of the film precursors, substrate surface, and the catalyst. The deposition may be carried out at atmospheric pressure, but may also be carried out at reduced pressure. The vapor pressure of the catalyst should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and catalyst used and pressure. The properties of the specific substrate, film precursors, and catalyst may be evaluated using methods known in the art, allowing selection of appropriate temperature and pressure for the reaction.

Also, according to one or more embodiments, the chamber or substrate may be heated such that deposition can take place at a temperature more than about 200° C. This stands in contrast to previously used precursors which did not exhibit satisfactory lifetimes at the wafer, and thus did not result in deposition. In further embodiments, deposition may take place at temperatures more than about 150° C., and further still, above 75° C. In other embodiments, the substrate has a temperature of less than about 800, 700 or 600° C.

In an exemplary embodiment of an ALD process, a first chemical precursor ("A") is pulsed, for example, silicon precursor to the substrate surface in a first half reaction. Excess unused reactants and the reaction by-products are removed, typically by an evacuation-pump down and/or by a flowing inert purge gas. Then a co-reactant "B", for example an oxidant, is delivered to the surface, wherein the previously reacted terminating substituents or ligands of the first half reaction are reacted with new ligands from the "B" co-reactant, creating an exchange by-product. A second purge period is typically utilized to remove unused reactants and the reaction by-products. The catalyst of formula (I) may be flowed with the "A" precursor, "B" precursor, or both precursors. The "A" precursor, "B" co-reactants and purge gases can then again be flowed. The alternating exposure of the surface to reactants "A" and "B" is continued until the desired thickness film is reached, for example in the range of 5 nm to 40 nm, and more specifically in the range of 10 and 30 nm (100 Angstroms to 300 Angstroms). It will be understood that the "A", "B", and purge gases can flow simultaneously, and the substrate and/or gas flow nozzle can oscillate such that the substrate is sequentially exposed to the A, purge, and B gases as desired.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

Films deposited by catalytic deposition processes have many potential applications. For example, deposited $SiO_2$ films may be useful as diffusion barriers. In embodiments, where the catalyst allows for relatively low temperature deposition, it is possible to deposit films onto substrates that are usually prone to damage at higher temperatures. Examples of such substrates include, but are not limited to, biological substrates.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method depositing a film on a substrate surface, the method comprising activating a reaction between at least two film precursors with a catalyst having a structure represented by:

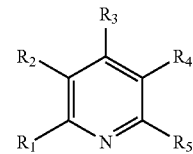

wherein $R_1$, $R_2$, $R_3$, $R_4$ and $R_5$ are independently H or $C_{1-10}$ alkyl, with the proviso that $R_1$, $R_2$, $R_3$, $R_4$, and $R_5$ are not all H, and the catalyst is present adjacent the substrate surface during the reaction.

2. The method of claim 1, wherein the catalyst has a vapor pressure below about $4 \times 10^{-5}$ Torr at 300 K.

3. The method of claim 1, wherein the catalyst has a vapor pressure below that of pyridine.

4. The method of claim 1, wherein $R_1$, $R_2$, $R_4$, and $R_5$ are H and $R_3$ is t-butyl.

5. The method of claim 1, wherein the catalyst has a molar mass of between about 93.13 g/mol and 150 g/mol.

6. The method of claim 1, wherein the substrate surface has a temperature that is maintained above about 75° C. during the reaction.

7. The method of claim 6, wherein the substrate surface has a temperature that is maintained above about 150° C. during the reaction.

8. The method of claim 7, wherein the substrate surface has a temperature that is maintained above about 200° C. during the reaction.

9. The method of claim 1, wherein the substrate surface has a temperature that is maintained below about 600° C. during the reaction.

10. A method of catalytic deposition of $SiO_2$, the method comprising:
  exposing a substrate surface to a flow of a silicon precursor;
  reacting the silicon precursor with an oxidizing source in the presence of a catalyst having a structure represented by:

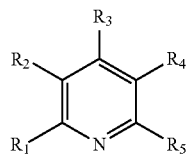

wherein $R_1$, $R_2$, $R_3$, $R_4$ and $R_5$ are independently H or $C_{1-10}$ alkyl, with the proviso that $R_1$, $R_2$, $R_3$, $R_4$, and $R_5$ are not all H.

11. The method of claim 10, wherein the catalyst has a vapor pressure below that of pyridine.

12. The method of claim 10, wherein $R_1$, $R_2$, $R_4$, and $R_5$ are H and $R_3$ is t-butyl.

13. The method of claim 10, wherein catalyst has a molar mass of between about 93.13 g/mol and 150 g/mol.

14. The method of claim 10, wherein during deposition the substrate surface has a temperature of above about 75° C.

15. The method of claim 14, wherein during deposition the substrate surface has a temperature of above about 150° C.

16. The method of claim 15, wherein during deposition the substrate surface has a temperature of below about 600° C.

17. A method of catalytic deposition of $SiO_2$, the method comprising:
  exposing a substrate surface to a flow of a silicon precursor;
  reacting the silicon precursor with water and in the presence of a catalyst comprising 4-tert-butylpyridine.

18. The method of claim 17, wherein during deposition the substrate surface has a temperature of above about 75° C.

19. The method of claim 18, wherein during deposition the substrate surface has a temperature of above about 150° C.

20. The method of claim 17, wherein during deposition the substrate surface has a temperature of below about 600° C.

* * * * *